United States Patent
Ohba et al.

(10) Patent No.: US 7,688,914 B2
(45) Date of Patent: Mar. 30, 2010

(54) DISTORTION COMPENSATION IN WIRELESS DIGITAL COMMUNICATION

(75) Inventors: Takeshi Ohba, Kawasaki (JP); Yasuhito Funyu, Kawasaki (JP); Hideharu Shako, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 974 days.

(21) Appl. No.: 11/319,046

(22) Filed: Dec. 27, 2005

(65) Prior Publication Data

US 2007/0042726 A1    Feb. 22, 2007

(30) Foreign Application Priority Data

Aug. 17, 2005   (JP) ............... 2005-236814

(51) Int. Cl.
  *H04L 25/49*   (2006.01)
  *H03C 1/06*    (2006.01)
(52) U.S. Cl. ................... 375/296; 332/159
(58) Field of Classification Search ........... 375/285, 375/295, 296, 297; 332/107, 123, 159; 455/50.1, 455/63.1, 91, 114.2, 114.3
See application file for complete search history.

(56) References Cited

U.S. PATENT DOCUMENTS

| | | | |
|---|---|---|---|
| 6,351,677 B1 * | 2/2002 | Leyonhjelm et al. ......... | 700/44 |
| 6,493,400 B1 * | 12/2002 | Greeley et al. ............ | 375/297 |
| 7,469,491 B2 * | 12/2008 | McCallister et al. ........ | 375/296 |
| 2005/0073361 A1 * | 4/2005 | Hamada et al. ............ | 330/149 |
| 2005/0238114 A1 | 10/2005 | Ishikawa | |

FOREIGN PATENT DOCUMENTS

| | | |
|---|---|---|
| EP | 1 499 027 | 1/2005 |
| EP | 1 511 181 | 3/2005 |
| EP | 1-755-302 A2 * | 2/2007 |
| JP | 6-37831 | 2/1994 |
| WO | 99/23756 | 5/1999 |
| WO | WO 03/103163 A1 | 12/2003 |

OTHER PUBLICATIONS

Extended European Search Report dated Aug. 13, 2007 from corresponding European Application.

* cited by examiner

*Primary Examiner*—Tesfaldet Bocure
(74) *Attorney, Agent, or Firm*—Katten Muchin Rosenman LLP

(57) ABSTRACT

A distortion compensating technique applied to a transmitter for transmitting a quadrature modulated signal in a wireless digital communication system is provided. A phase adjustment value is determined for a quadrature demodulated feedback signal based on comparison between the feedback signal and a reference signal to be transmitted from the transmitter. This phase adjustment value is compared with the previous phase adjustment value. If the comparison result between the current and previous phase adjustment values satisfies a prescribed condition, correction for quadrature modulation, such as DC offset correction, orthogonality correction, or IQ amplitude correction, is performed.

8 Claims, 13 Drawing Sheets

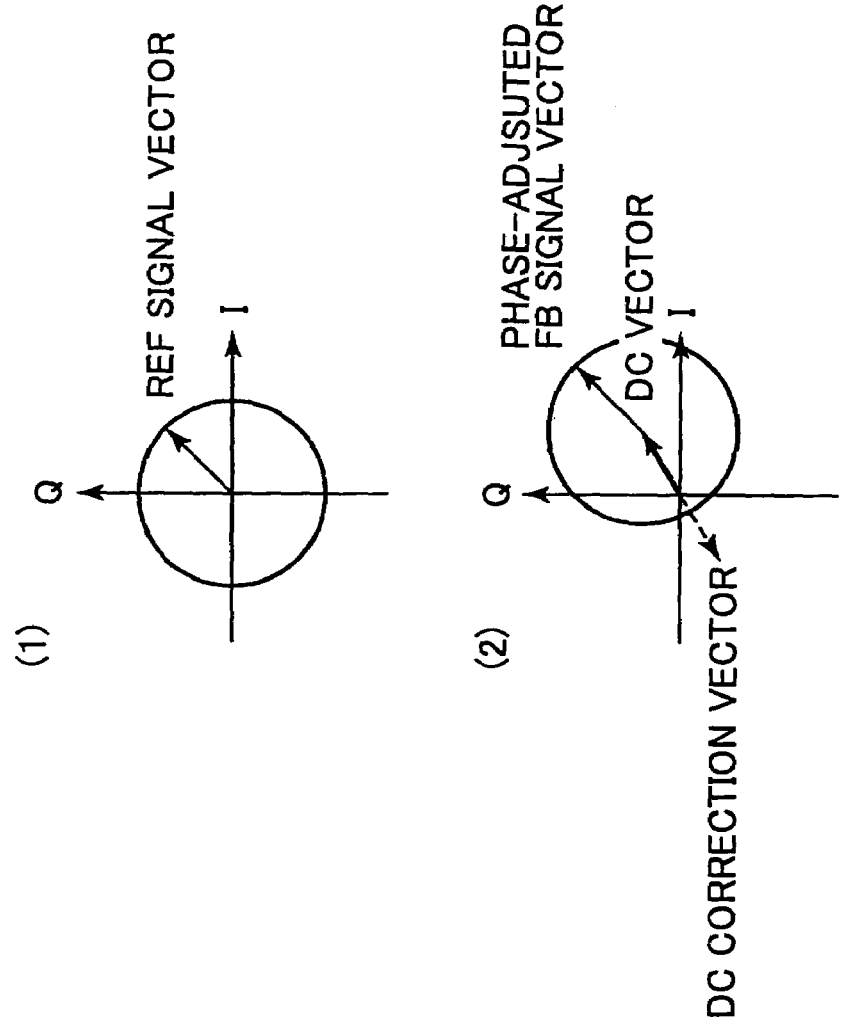
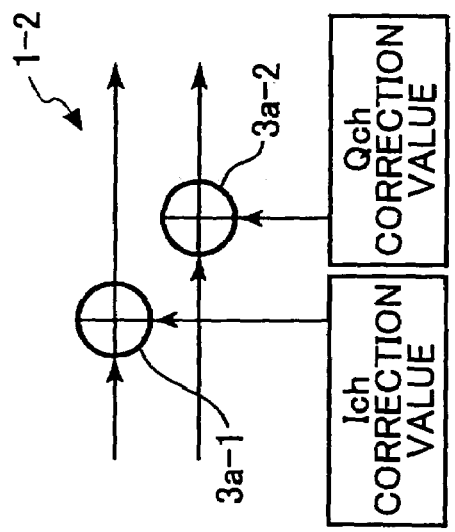

DISTORTION COMPENSATION IN WIRELESS DIGITAL COMMUNICATION

BACKGROUND OF THE INVENTION

1. Field of the Invention

The present invention generally relates to distortion compensation, and more particularly, to a distortion compensation technique applied to a transmitter for transmitting quadrature modulated signals in wireless digital communication systems.

2. Description of the Related Art

In mobile communications, including IMT-2000, broadband radio services are being offered, and especially, broaderband radio transmission is being discussed for the next-generation mobile communication schemes. In general, complex baseband signals are first converted to an intermediate frequency (IF) band, and the IF signals are further converted to radio frequency (RF) signals suitable for broadband radio transmission.

Such broadband mobile communication systems require bandpass filters to have steep filter characteristics, as well as a flat characteristic over the entire passband, in order to sufficiently reduce high-frequency components generated during the frequency conversion. However, since sophisticated and high-performance devices and circuits are required in broadband radio transmission, the device scale and the manufacturing cost increase consequently. To avoid this inconvenience, direct RF modulation schemes for converting baseband signals directly to RF signals are attracting attentions.

Meanwhile, in recent years and continuing, highly efficiency digital transmission schemes are widely employed in wireless communication systems. When employing a multi-level phase modulation scheme known as one of the high efficiency transmission schemes, a technique for reducing non-linear distortion in a power amplifier and adjacent channel leakage at a transmission end is required to improve power efficiency. This technique, known as distortion compensation, is an adaptive predistortion type for a transmission amplifier.

With a distortion compensating transmission amp of an adaptive predistortion type, a portion of the output signal (quadrature modulated signal) of the transmitter is subjected to quadrature demodulation to produce a feedback signal, and the feedback signal is compared with a transmission signal (reference signal) prior to quadrature modulation. Based on the comparison result, a weighting factor for distortion compensation is updated in real time. The transmission signal (reference signal) is multiplied by the updated weighting factor in order to give an inverted characteristic to the transmission signal in advance, and then quadrature modulation and power amplification are performed on the distortion compensated transmission signal. After the quadrature modulation and power amplification, the transmission signal is finally transmitted from the transmitter. See, for example, International Patent Publication WO 03/103163.

However, with such a direct RF modulation scheme, errors are generated in both the in-phase component and the quadrature component of the transmission signal to be supplied to the quadrature modulator, due to variation in analog devices and change over time. As a result, undesirable leakage of waves is generated as imaginary components in the modulated analog transmission signals, which causes degradation of the transmission signal quality.

In addition, the transmission signal (reference signal) is delayed using a delay element in the comparison process with the feedback signal in order to make the phases of the transmissions signal and the feed back signal be consistent with each other. Even if the delay time is correctly set in the delay element, the phase of the feedback signal itself fluctuates due to clock jitter caused by thermal noise or external disturbance. In short, it is difficult for a conventional adaptive predistortion technique to guarantee stable and reliable distortion compensation, which technique is likely to generate undesirable out-of-band power radiation.

Another publication, Japanese Patent Application Laid-open (Kokai) No. 6-37831A, discloses a linear transmission circuit of a wireless digital transmission scheme having a non-linear distortion compensating circuit for a high power amplifier. In this publication, the phase difference between the reference signal and the feedback signal is measured during the rising period of a burst signal, and the demodulation phase of the feedback signal is adjusted based on the measurement result so as to allow the measurement of the phase difference to be performed with least measuring error. This technique aims to guarantee correct operation of distortion compensation.

However, due to malfunction of analog circuits, including an oscillator for a down converter, the phase difference between the reference signal and the feedback signal may not be correctly determined. In this case, distortion compensation and/or other corrections cannot be performed correctly, causing abnormal operations.

FIG. 1 is a diagram illustrating phase adjustment results performed in normal operation and abnormal operation of the oscillator for a down converter. In the normal operation, the phase is set to substantially 90 degrees to maintain orthogonality. In contrast, during malfunctioning of the oscillator, the phase varies randomly ranging from −180° to 180° even after the phase adjustment.

SUMMARY OF THE INVENTION

The present invention is conceived in view of the above-described problems in the prior art, and it is an object of the invention to provide a distortion compensation technique that allows a transmitter to transmit a high-quality distortion-compensated and quadrature modulated signal, without causing undesirable leakage of out-of-band radiation.

In a preferred embodiment, it is determined whether the phase difference between the feedback signal and the reference signal reside in a normal range, and if the phase difference is in the normal range, distortion compensation and/or other corrections for quadrature modulation are performed.

In one aspect of the invention, a distortion compensating device-applied to a transmitter for transmitting a quadrature modulated signal in a wireless digital communication system is provided. The distortion compensating device includes:

(a) a phase adjusting unit configured to determine a phase adjustment value for a feedback signal subjected to quadrature demodulation, based on comparison between the feedback signal and a reference signal to be transmitted from the transmitter;

(b) a phase adjustment result storing unit configured to store a current phase adjustment result representing the determined phase adjustment value;

(c) a phase adjustment result comparison and determination unit configured to compare a current phase adjustment result with a previous phase adjustment result; and (d) a correction control unit configured to allow correction for quadrature modulation to be performed if the phase adjustment comparison result satisfies a prescribed condition.

In a preferred example, correction for quadrature modulation is performed if the phase adjustment comparison result satisfies the prescribed condition at least a prescribed number of times.

Examples of correction for quadrature modulation include direct current (DC) offset correction, orthogonality correction, and amplitude correction performed on the in-phase component and the quadrature component of the reference signal.

In another preferred example, distortion compensation is performed if the difference between the current phase adjustment result and the previous phase adjustment result is within a prescribed range.

In another aspect of the invention, a distortion compensating method applied to a transmitter for transmitting a quadrature modulated signal in a wireless digital communication system is provided. This method includes the steps of:

(a) determining a current phase adjustment value for a feedback signal subjected to quadrature demodulation, based on comparison between the feedback signal and a reference signal to be transmitted from the transmitter;

(b) comparing the current phase adjustment value with a previous phase adjustment value; and (c) allowing correction for quadrature modulation to be performed if the current phase adjustment value resides in an acceptable error range with respect to the previous phase adjustment value at least a prescribed number of times.

BRIEF DESCRIPTION OF THE DRAWINGS

Other objects, features, and advantages of the resent invention will become more apparent from the following detailed description when read in conjunction with the accompanying drawings, in which:

FIG. 4A and FIG. 4B are schematic diagrams for explaining direct current (DC) offset correction.

DETAILED DESCRIPTION OF THE PREFERRED EMBODIMENTS

Figure 1:
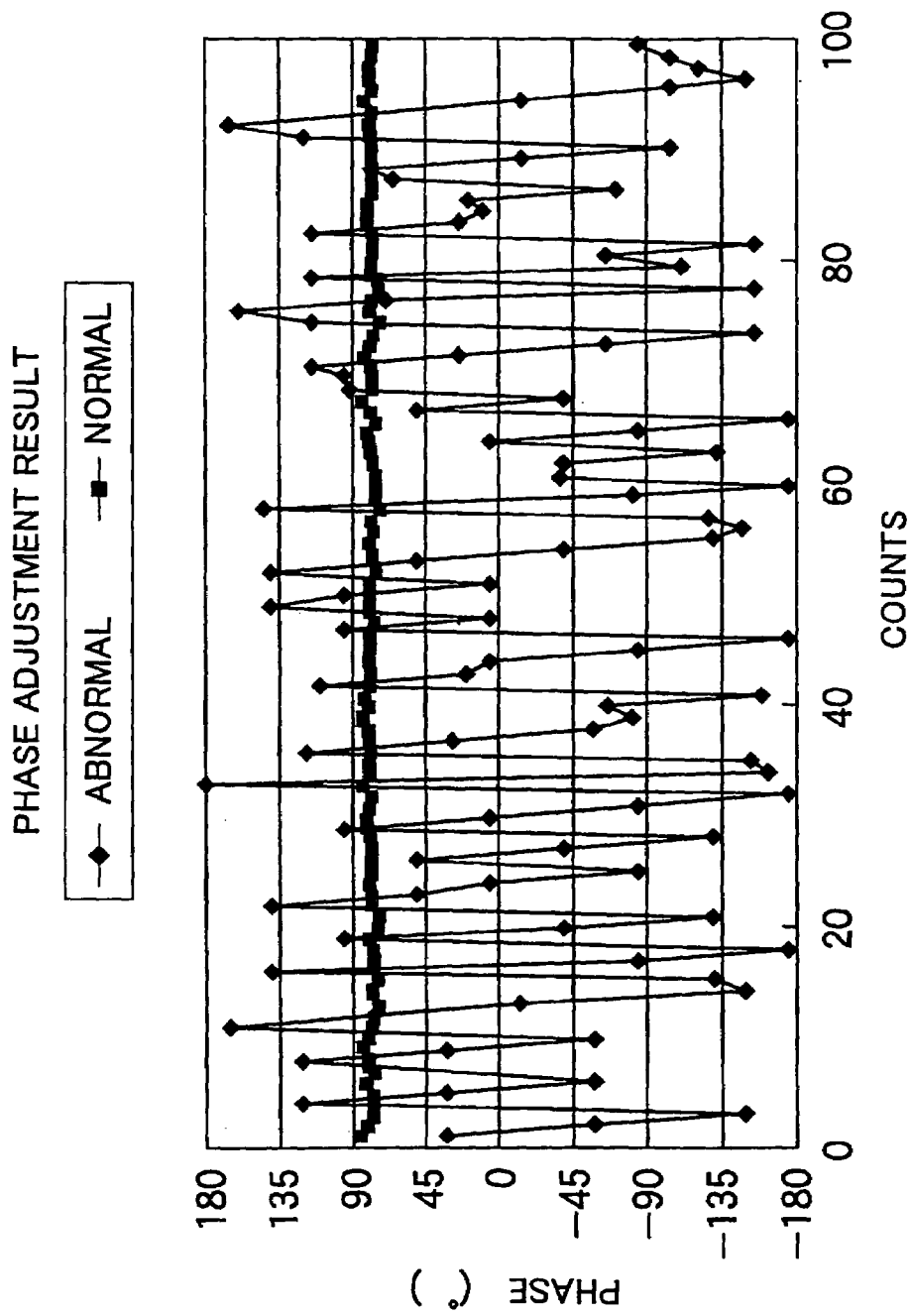
FIG. 1 is a diagram illustrating phase adjustment results in normal operation and abnormal operation.
Figure 2A:
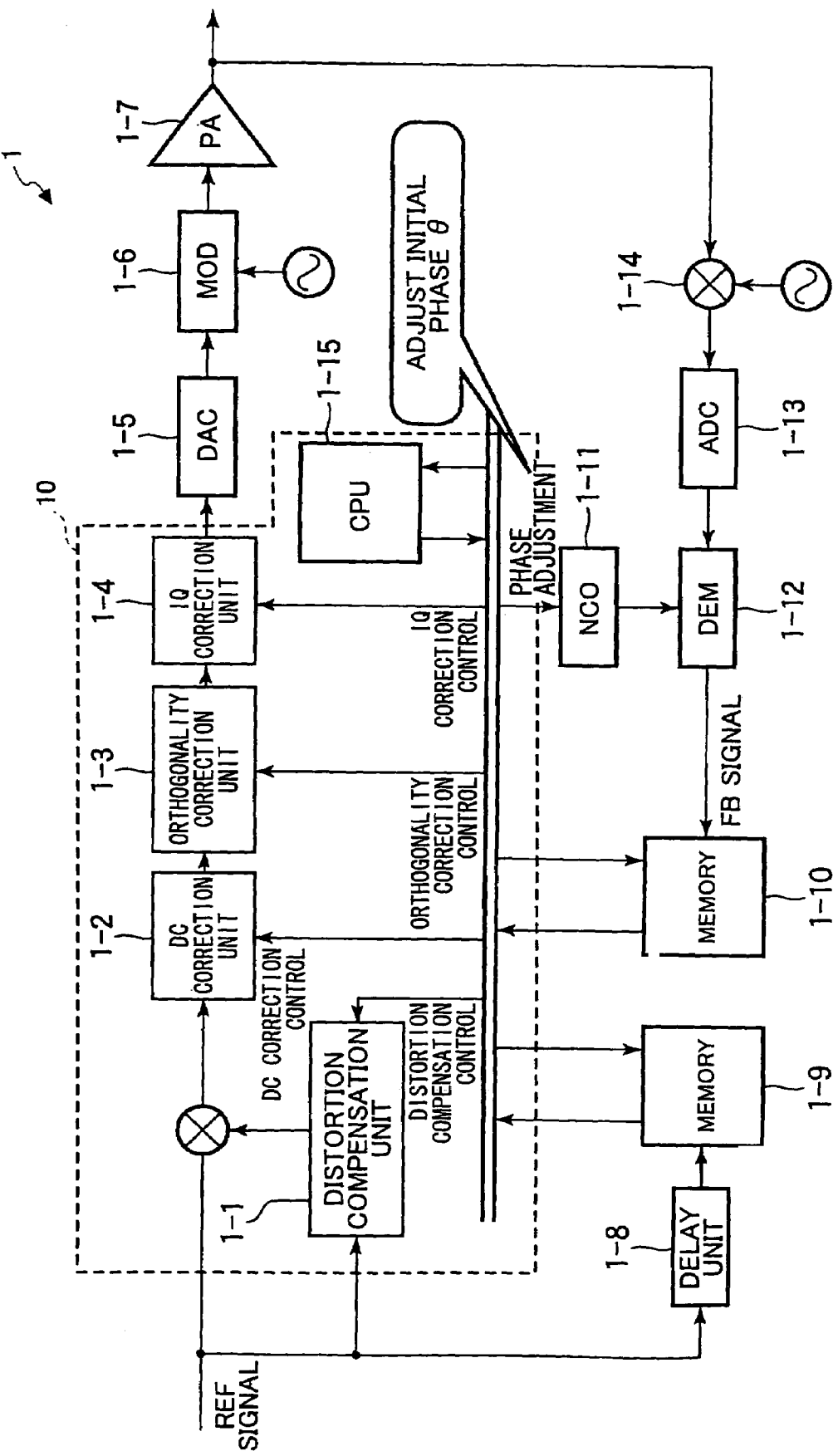
FIG. 2A is a schematic block diagram of a distortion compensating device applied to a transmitter.
Figure 2B:
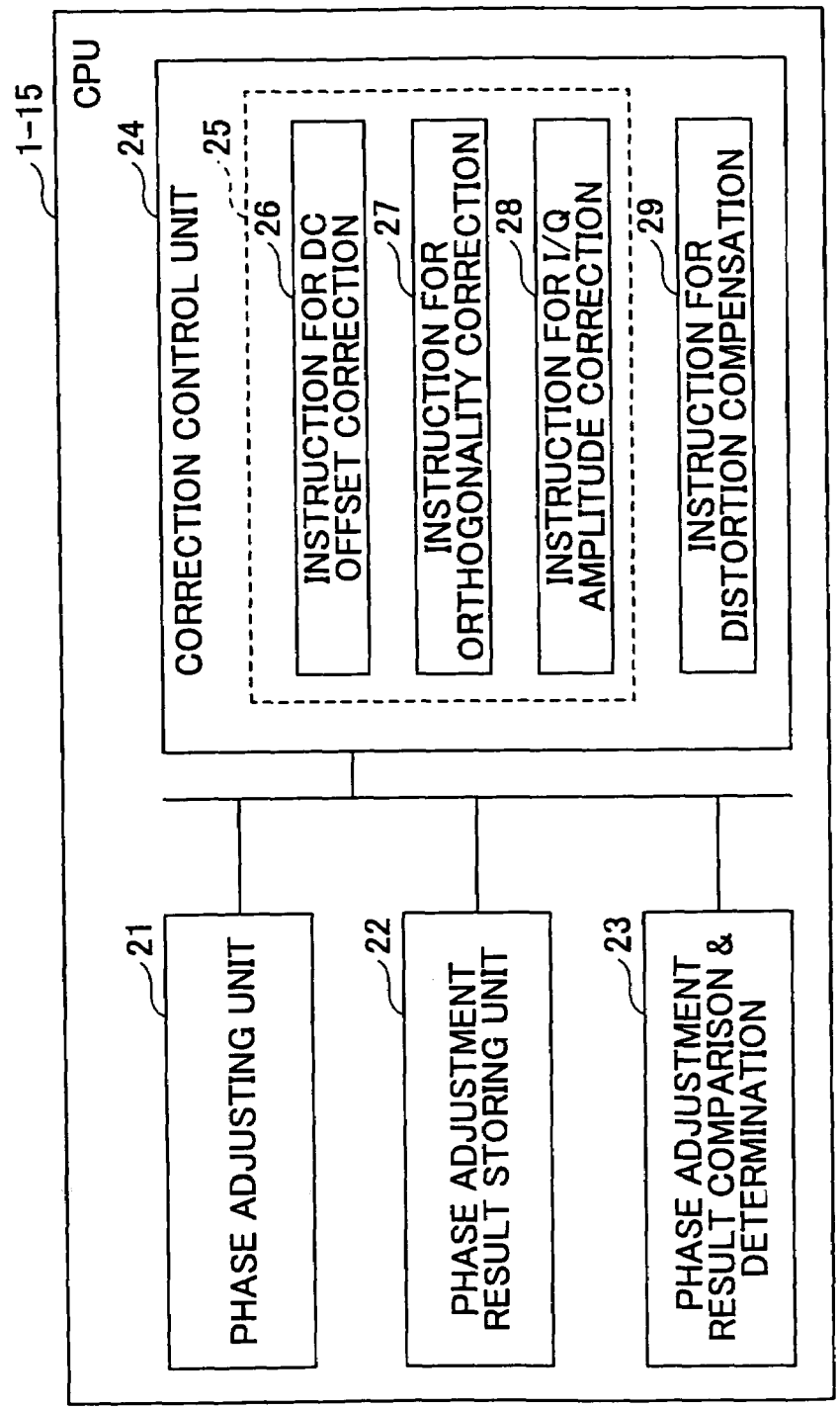
FIG. 2B is a functional block diagram of the CPU used in the distortion compensating device shown in FIG. 2A.

FIG. 2A is a schematic block diagram of a distortion compensating device 10 applied to a transmitter 1 of a direct RF modulation type, and FIG. 2B is a schematic block diagram of CPU 1-15 shown in FIG. 2A. The transmitter 1 (or the distortion compensating device 10) includes a distortion compensation unit 1-1, a direct current (DC) correction unit 1-2, an orthogonality correction unit 1-3, an IQ correction unit 1-4, a digital-to-analog converter (DAC) 1-5, and a CPU 1-15. The transmitter 1 also includes a quadrature modulator (MOD) 1-6, a power amplifier (PA) 1-7, a delay unit 1-8, memories 1-9 and 1-10, a digital oscillator (NCO) 1-11, a quadrature demodulator (DEM) 1-12, an analog-to-digital converter (ADC) 1-13, and a down converter 1-14.

The CPU 1-15 includes a phase adjusting unit 21, a phase adjustment result storing unit 22, a phase adjustment result comparison and determination unit 23, and a correction control unit 24, as illustrated in FIG. 2B. The correction control unit 24 has a quadrature modulation correcting instruction generator 25, and a distortion compensation control instruction generator 29. The quadrature modulation correcting generator generates, for example, a DC offset correction instruction 26 for controlling the operation of the DC correction unit 1-2, an orthogonality correction instruction 27 for controlling the operation of the orthogonality correction unit 1-3, and an IQ amplitude correction instruction 28 for controlling the operation of the IQ correction unit 1-4.

A portion of the transmission signal to be output from the power amplifier (PA) 1-7 is branched, and subjected to frequency conversion to an intermediate frequency by the down converter 1-14, which signal is then converted to a digital signal by the analog-to-digital converter (ADC) 1-13. The A/D converted signal is subjected to quadrature demodulation by the quadrature demodulator (DEM) 1-12, and stored as a feedback signal (FB) in the memory 1-10.

A portion of the transmission signal input to the transmitter 1 is also branched and used as a reference signal (Ref). The reference signal is delayed at the delay unit 1-8 for a duration corresponding to the feedback time of the feedback signal (FB), and then stored in the memory 1-9.

The phase adjusting unit 21 of the CPU 1-15 adjusts and sets initial phase θ in the NCO 1-11 for quadrature demodulation of a current feedback signal, based on feedback signal FB and reference signal Ref read from the memories 1-10 and 1-9, respectively. The phase adjustment result storing unit 22 stores the phase adjustment result (phase θ). The phase adjustment result comparison and determination unit 23 compares the current phase adjustment result with the previous phase adjustment result stored in the phase adjustment result storing unit 22, and determines whether the comparison result satisfies a prescribed condition (for example, whether the difference between the current and previous phase adjustment results resides in a prescribed range). The correction control unit 24 controls distortion compensation and/or correction for quadrature modulation (including DC correction, orthogonality correction, and IQ amplitude correction) based on the comparison result of the current and previous phase adjustment results.

Returning to FIG. 2A, the CPU 1-15 also determines a distortion compensation weighting factor (or coefficient) for the distortion compensation unit 1-1, based on comparison between the reference signal (Ref) and the feedback signal (FB) read from the memories 1-9 and 1-10, respectively, and supplies the weighting factor (or coefficient) to the distortion compensation unit 1-1. The distortion compensation unit 1-1 updates the weighting factor in real time, in response to the receipt of the newly supplied weighting factor, and multiplies the reference signal (Ref) by the updated weighting factor to give an inverted distortion characteristic of the power amp characteristic or other distortion characteristics to the reference signal (transmission signal) in advance. In this manner, distortion due to power amplifier (PA) 1-7 and other components is compensated for.

The above-described distortion compensation is performed when the CPU 1-15 supplies a distortion compensation instruction, that is, when the phase adjustment comparison result satisfies a prescribed condition.

Next, adjustment of the initial phase θ is explained below. To deal with the phase fluctuation of the feedback signal (FB), the initial phase of the digital oscillator (NCO) 1-11 used for the quadrature demodulator (DEM) 1-12 is adjusted.

The CPU 1-15 performs arithmetic operations using the reference signal (Ref) data and the feedback signal (FB) data read from the memories 1-9 and 1-10, respectively. Reference signal (Ref) and the feedback signal (FB) are expressed as $$Ref = Ref\_ich + jRef\_qch$$

$$FB = FB\_ich + jFB\_qch \quad (1)$$

where Ref denotes a reference signal, Ref_ich denotes the in-phase component of the reference signal, Ref_qch denotes the quadrature component of the reference signal, FB denotes a feedback signal, FB_ich denotes the in-phase component of the feedback signal, and FB_qch denotes the quadrature component of the feedback signal.

A correlation value C is calculated by $$C = \Sigma Ref \times FB^* \quad (2)$$
$$= \Sigma(Ref\_ich + jRef\_qch) \times (FB\_ich - jFB\_qch).$$

If FB=Ref×A exp(−jθ) holds, the correlation value C is also expressed as $$C = \Sigma Ref \times FB^* \quad (3)$$
$$= \Sigma Ref^* \times A\exp(j\theta)$$
$$= A \times \Sigma |Ref|^2 \exp(j\theta)$$

From exp(jθ)=cos θ+j sin θ, the real part and the imaginary part of the correlation value are expressed as $$C(\text{real}) = A \times \Sigma |Ref|^2 \cos\theta$$

$$C(\text{imaginary}) = A \times \Sigma |Ref|^2 \sin\theta \quad (4)$$

Figure 3:
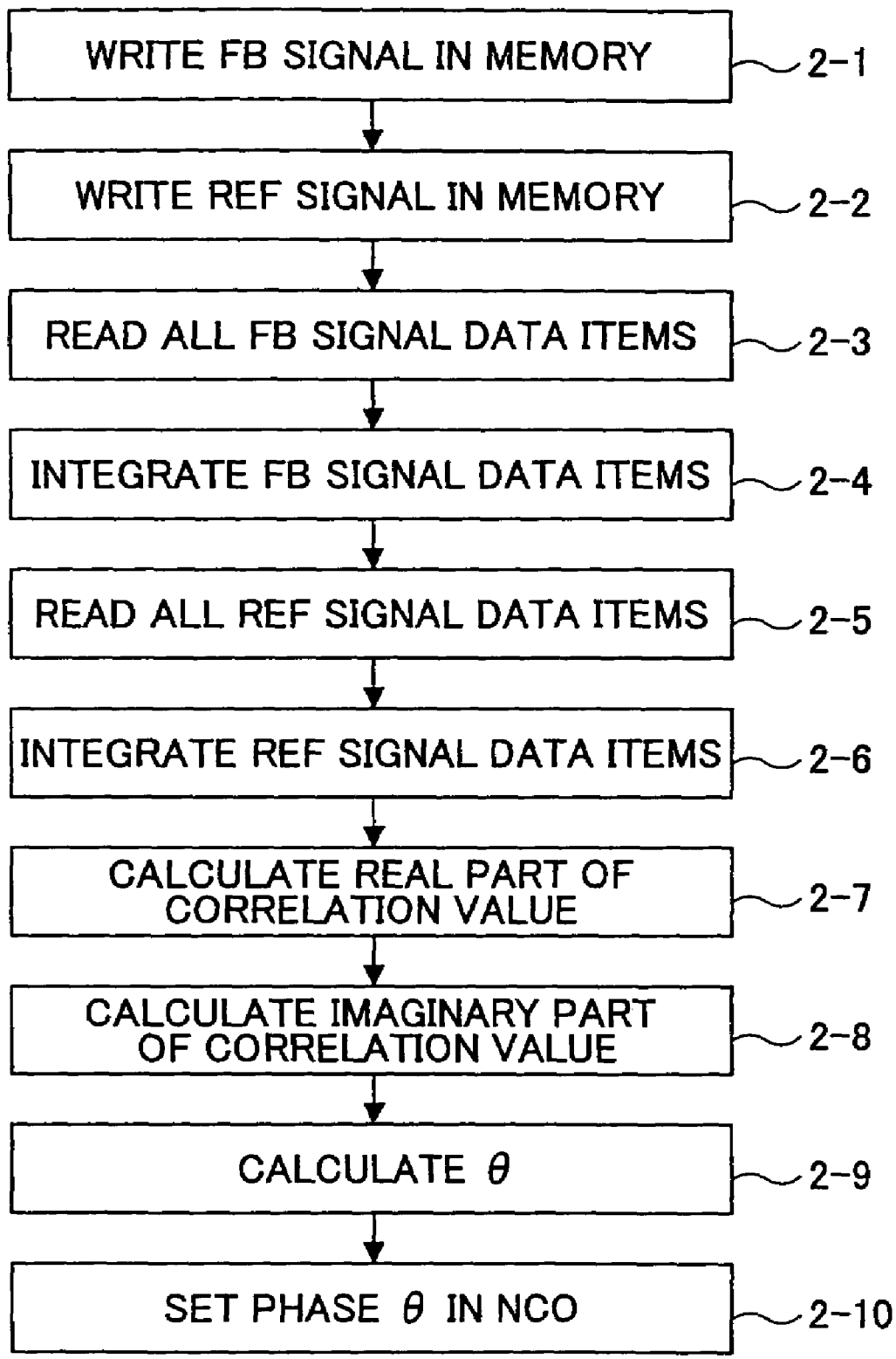
FIG. 3 is a flowchart of the phase adjustment operations for setting a phase adjustment value θ for a feedback signal.

Based on the correlation result, $$\theta = \tan^{-1}[C(\text{real})/C(\text{imaginary})] \quad (5)$$

is determined. The phase θ is set as the initial phase of the digital oscillator (NCO) 1-11 used for the quadrature demodulator (DEM) 1-12. This operations flow is illustrated in FIG. 3.

First, feedback signal (FB) data are written in memory 1-10 (step 2-1), and reference signal (Ref) data are written in memory 1-9 (step 2-2). All the feedback signal (FB) data items written in the memory 1-10 are read (step 2-3) and integrated (step 2-4). Similarly, all the reference signal (Ref) data items written in the memory 1-9 are read (step 2-5) and integrated (step 2-6).

Then, the real part and the imaginary part of the correlation value are calculated (step 2-7 and step 2-8, respectively) using equation (4), and a phase θ is calculated from the real part and the imaginary part of the correlation value (step 2-9). The determined phase θ is set as the initial phase of the digital oscillator (NCO) 1-11.

Next, explanation is made of DC offset correction carried out by the DC correction unit 1-2.

FIG. 4A and FIG. 4B are diagrams showing direct current (DC) offset correction. As illustrated in FIG. 4A, the DC correction unit 1-2 has a first adder 3a-1 for adding an in-phase (Ich) correction value to the in-phase (Ich) component, and a second adder 3a-2 for adding a quadrature (Qch) correction value to the quadrature (Qch) component.

Using the reference signal (Ref) and the phase-adjusted feedback signal (FB), which signals are expressed as $$Ref = Ref\_ich + jRef\_qch$$

$$FB = FB\_ich + jFB\_qch, \quad (1)$$

a correction vector is expressed as Ref−FB.

FIG. 4B(1) and FIG. 4B(2) illustrate a reference signal (Ref) vector and a phase-adjusted feedback signal (FB) vector, respectively. The reference signal (Ref) vector does not contain direct current (DC) offset component, while the phase-adjusted feedback signal (FB) contains a direct current (DC) vector component generated by the quadrature modulator (MOD) 1-6 and/or other elements.

Figure 4C:
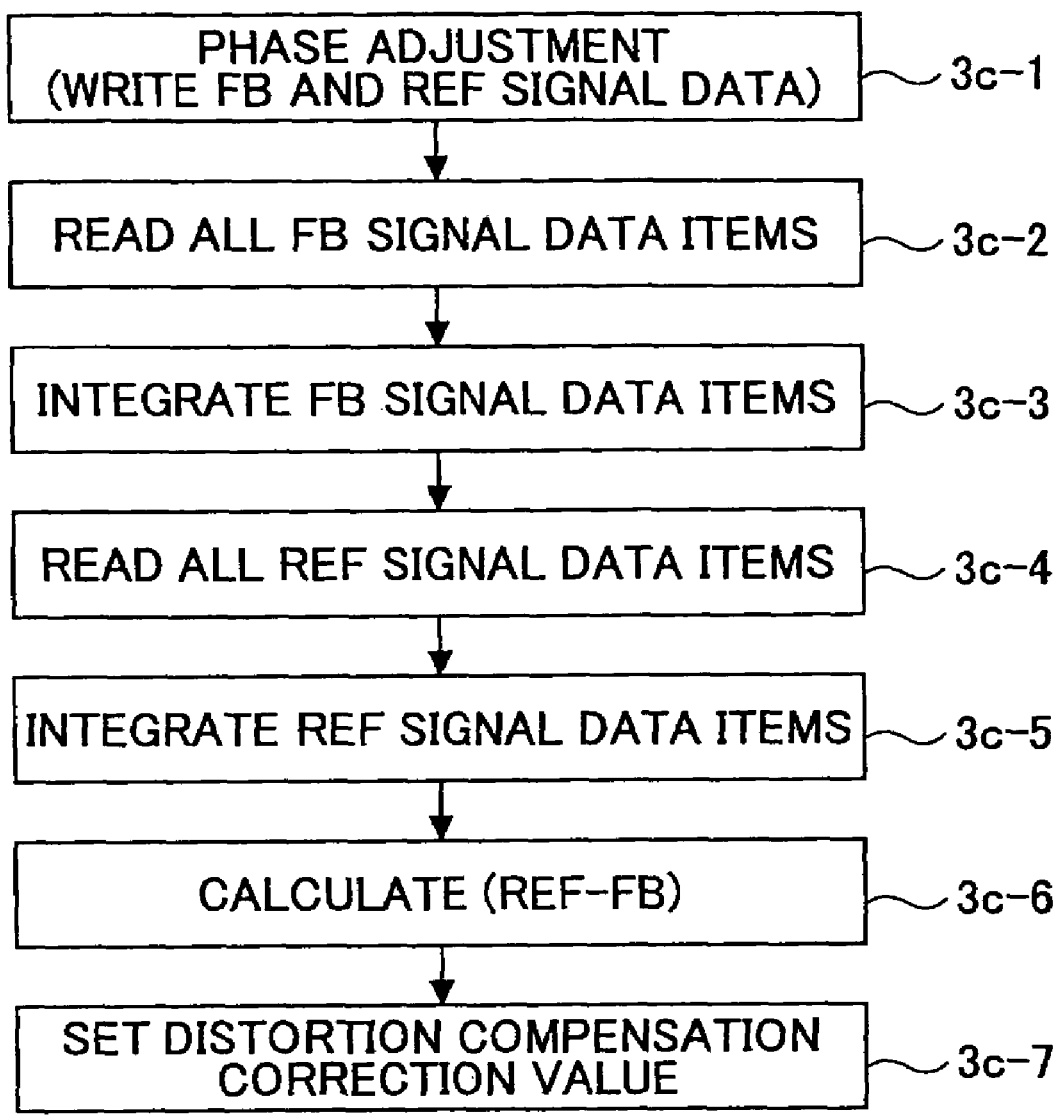
FIG. 4C is a flowchart of DC offset correction.

FIG. 4C is an operations flow of direct current (DC) offset correction. The current feedback signal (FB) is subjected to phase adjustment and written in the memory 1-10 (step 3c-1). Then, all the feedback signal (FB) data items are read from the memory 1-10 (step 3c-2) and integrated (step 3c-3).

All the reference signal (Ref) data items are also read from the memory 1-9 (step 3c-4) and integrated (step 3c-5). The reference signal (Ref) data have also been written in the memory 1-9 in the step of phase adjustment. A correction vector is calculated by subtracting the integrated feedback signal (FB) from the integrated reference signal (Ref) (step 3c-6), and the calculated correction vector is set as the direct current (DC) correction value (step 3c-7).

Next, explanation is made of orthogonality correction carried out by the orthogonality correction unit 1-3. An output signal from the quadrature modulator (MOD) 1-6 contains deviation from orthogonality, and is expressed as $$I\cos\omega t + Q\sin(\omega t + \phi) \quad (6)$$

where ω denotes an angular frequency of quadrature modulation, φ denotes the deviation angle from orthogonality, I denotes the in-phase component of the input signal, and Q denotes the quadrature component of the input signal.

This output signal is fed back to the quadrature demodulator (DEM) 1-12, and an arithmetic operation expressed as $$[I\cos\omega t + Q\sin(\omega t + \phi)]*[\cos\omega t + j\sin\omega t] \quad (7)$$

is carried out on the feedback signal when it is quadrature demodulated and converted to a baseband signal.

The real part of equation (7) becomes $$I\cos^2\omega t + Q\sin(\omega t + \phi)\cos\omega t = (1/2)[I(1+\cos^2\omega t) + Q(\sin(2\omega t + \phi) + \sin\phi)]. \quad (8)$$

By removing the harmonic component from the output signal, the real part is expressed as $$\text{Output}(\text{Real}) = (1/2)(I + Q\sin\phi). \quad (9)$$

The imaginary part of equation (7) becomes $$[I\cos\omega t*\sin\omega t] + [Q\sin(\omega t + \phi)\cos\omega t*\sin\omega t] = (1/2)[\sin 2\omega t + Q(\cos\phi - \cos(2\omega t + \phi))] \quad (10)$$

By removing the harmonic component from the output signal, the imaginary part is expressed as $$\text{Output(imaginary)} = (1/2)Q\cos\phi. \tag{11}$$

Consequently, feedback signal (FB) expressed as $$FB = (1/2)[(I + Q\sin\phi) + jQ\cos\phi] \tag{12}$$

is output. This output signal can be rewritten in the form of I+jQ, without containing deviation from orthogonality, by setting $$Q' = Q/\cos\phi, \text{ and}$$

$$I' = I - Q\tan\phi. \tag{13}$$

Deviation angle $\phi$ from orthogonality is determined in the following process. Using the reference signal (Ref) and the feedback signal (FB) expressed as $$Ref = Ref\_ich + jRef\_qch$$

$$FB = FB\_ich + jFB\_qch, \tag{1}$$

a power level Pow_Ref of a reference signal (Ref) is expressed as $$Pow\_Ref = (Ref\_ich)^2 + (Ref\_qch)^2. \tag{14}$$

If the feedback signal (FB) contains phase rotation of $\theta$ and deviation angle $\phi$ from orthogonality, then the feed back signal (FB) is expressed as $$FB = [(Ref\_ich + (Ref\_qch)\sin\phi) + (jRef\_qch)\cos\phi] \times (\cos\theta + j\sin\theta). \tag{15}$$

Equation (15) is rewritten as $$FB = [(Ref\_ich)\cos\theta + (Ref\_qch)\sin(\phi-\theta)] + j[(Ref\_ich)\sin\theta + (Ref\_qch)\cos(\phi-\theta)], \tag{16}$$

and the feedback signal power level Pow_FB is expressed as $$Pow\_FB = (Ref\_ich)^2 + (Ref\_qch)^2 + 2(Ref\_ich)(Ref\_qch)\sin\phi = Pow\_Ref + 2(Ref\_ich)(Ref\_qch)\sin\phi. \tag{17}$$

From the foregoing description, the deviation angle $\phi$ from orthogonality is expressed as $$\phi = \sin^{-1}[(Pow\_FB - Pow\_Ref)/2(Ref\_ich)(Ref\_qch)]. \tag{18}$$

Figure 5A:
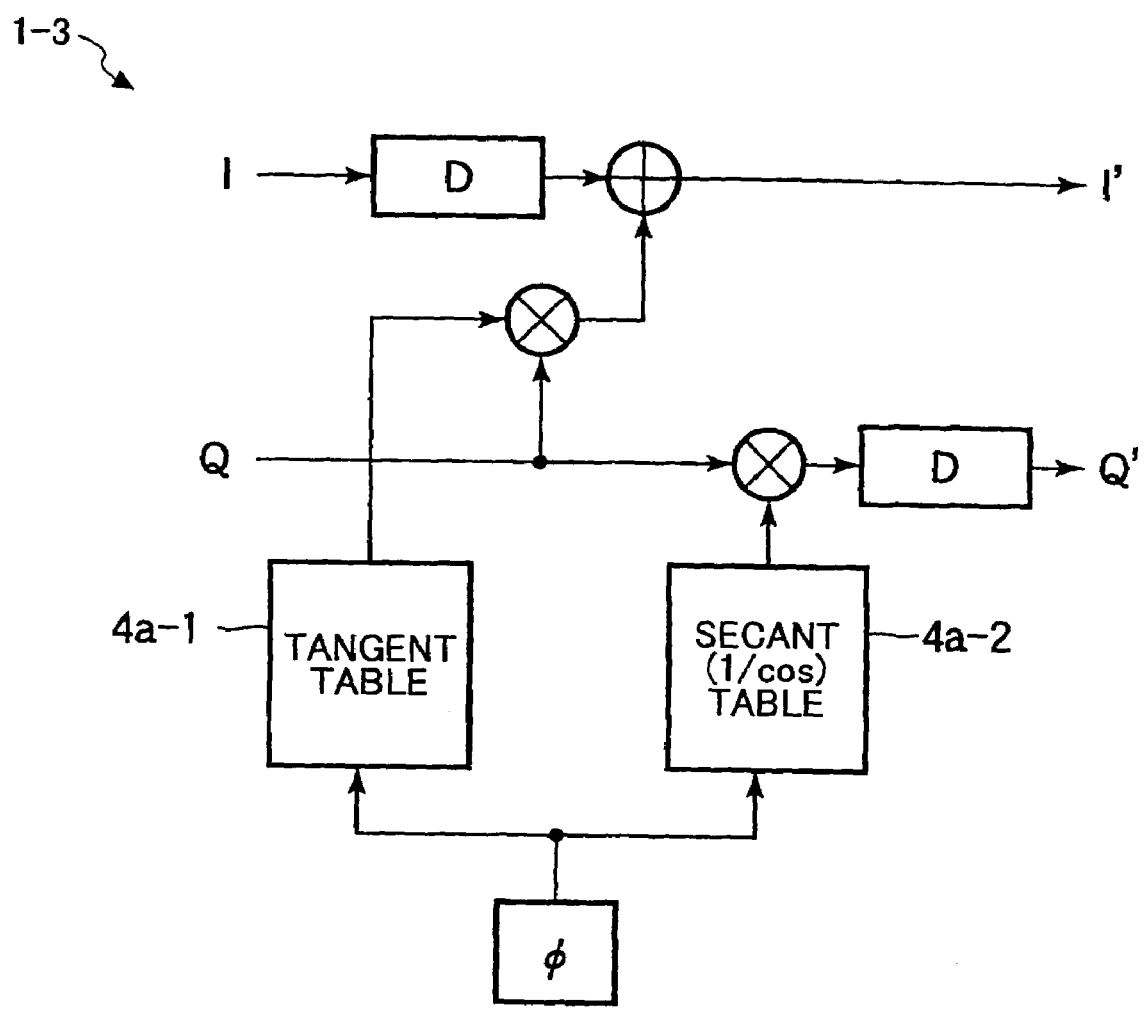
FIG. 5A is a schematic-circuit diagram for explaining orthogonality correction.
Figure 5B:
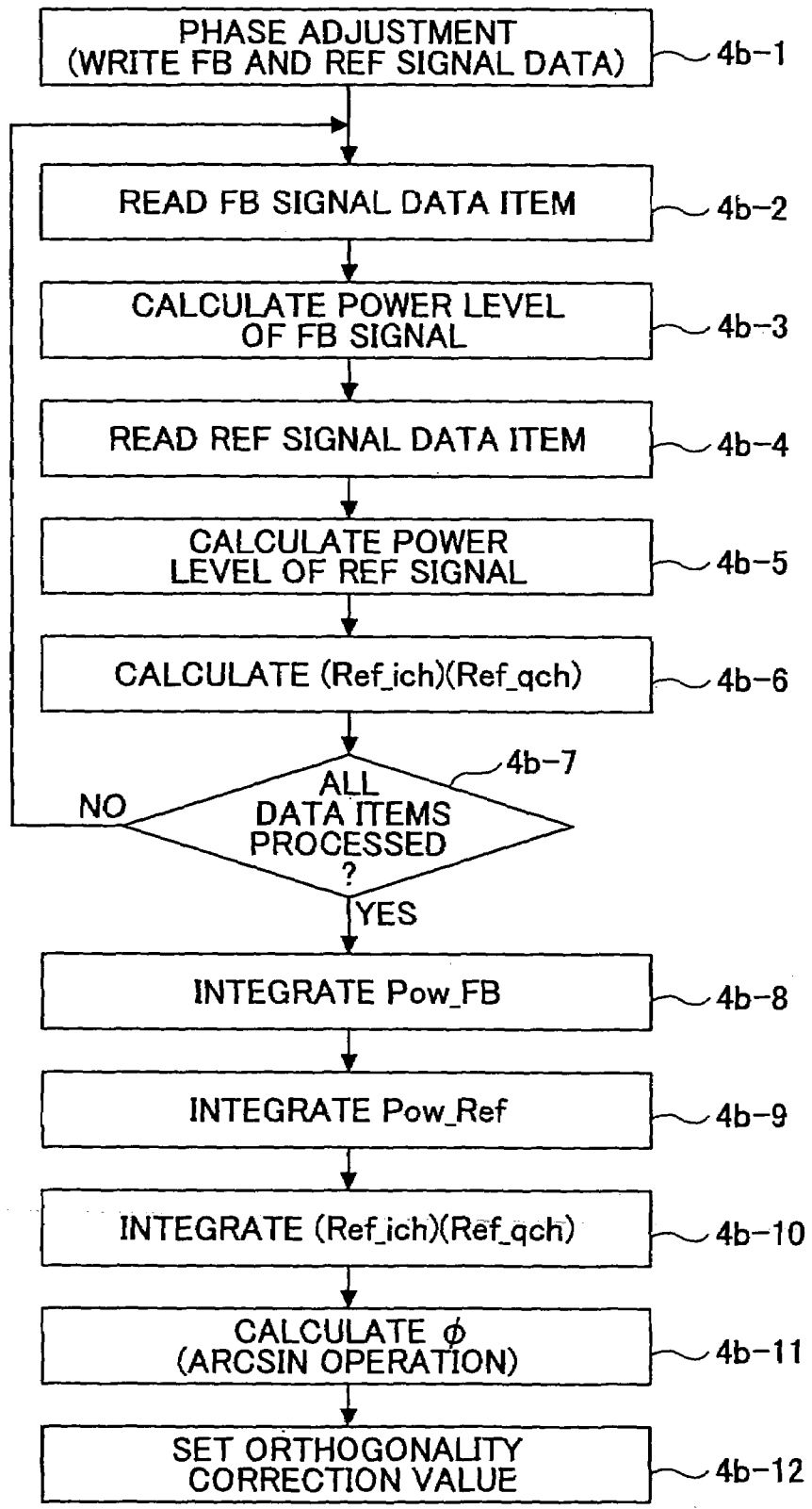
FIG. 5B is a flowchart of operations for orthogonality correction.

FIG. 5A illustrates an example of the orthogonality correction unit 1-3, and FIG. 5B illustrates an operations flow of the orthogonality correction process. The orthogonality correction unit 1-3 is configured to perform the above-described arithmetic operations, which are represented by $$Q' = Q/\cos\phi, \text{ and}$$

$$I' = I - Q\tan\phi, \tag{13}$$

on the in-phase component (I) and the quadrature component (Q) of the input signal. To realize this, the orthogonality correction unit 1-3 has a tangent table 4a-1 for acquiring tan $\phi$ and a secant (1/cos) table 4a-2 for acquiring (1/cos $\phi$) of the deviation angle $\phi$ from orthogonality. Using the calculated values tan $\phi$ and 1/cos $\phi$, parameters I' and Q' with the orthogonality corrected are output.

In the operation flow shown in FIG. 5B, the current feedback signal (FB) is subjected to phase adjustment and written in the memory 1-10 (step 4b-1). A feedback signal (FB) data item is read from the memory 1-10 (step 4b-2), and a power level Pow-FB of this feedback signal (FB) is calculated (step 4b-3).

Then, a reference signal (Ref) data item is read from the memory 1-9 (step 4b-4), and a power level Pow-Ref of this reference signal (Ref) is calculated (step 4b-5). The current reference signal (Ref) data item has been written in the memory 1-9 in the step of phase adjustment.

Then, the product (Ref_ich) (Ref_qch) of the real part and the imaginary part of the reference signal is calculated (step 4b-6). The steps 4b-2 through 4b-6 are repeated until all the feedback signal (FB) data items and the reference signal (Ref) data items are processed (step 4b-7).

When all the data items have been processed (YES in step 4b-7), the power levels Pow_FB of all the feedback signal data items are integrated and averaged (step 4b-8). Similarly, the power levels Pow_Ref of all the reference signal data items are integrated and averaged (step 4b-9). The products (Ref_ich) (Ref_qch) of all the reference signal data items are also integrated and averaged (step 4b-10).

Based on the feedback signal average power level Pow_FB, the reference signal average power level Pow_Ref, and the average product (Ref_ich) (Ref_qch) of the real part and the imaginary part of the reference signal, a deviation angle $\phi$ from orthogonality is calculated using Equation (18) (step 4b-11). This deviation angle $\phi$ is used as the orthogonality correction value (step 4b-12).

Next, explanation is made of amplitude correction for the in-phase component (I) and the quadrature component (Q) carried out by the IQ correction unit 1-4. If the cumulative value of the reference signals is expressed as Ref_Acm=ΣRef, and if the cumulative value of the feedback signals is expressed as FB_Acm=ΣFB, the mean absolute value of the reference signal Ref_Bal and the mean absolute value of the feedback signal FB_Bal are expressed, respectively, as $$Ref\_Bal = Ref\_Acm(\text{positive}) - Ref\_Acm(\text{negative})$$

$$FB\_Bal = FB\_Acm(\text{positive}) - FB\_Acm(\text{negative}). \tag{19}$$

Equation (19) represents that the negative summation of the reference signals (or the feedback signals) is subtracted from the positive summation of the reference signals (or the feedback signals).

Errors in amplitudes of in-phase component (I) and quadrature component (Q) are determined by (FB_Bal)−(Ref_Bal), and the amplitudes of the in-phase component (I) and the quadrature component (Q) are corrected based on the determined error.

Figure 6A:
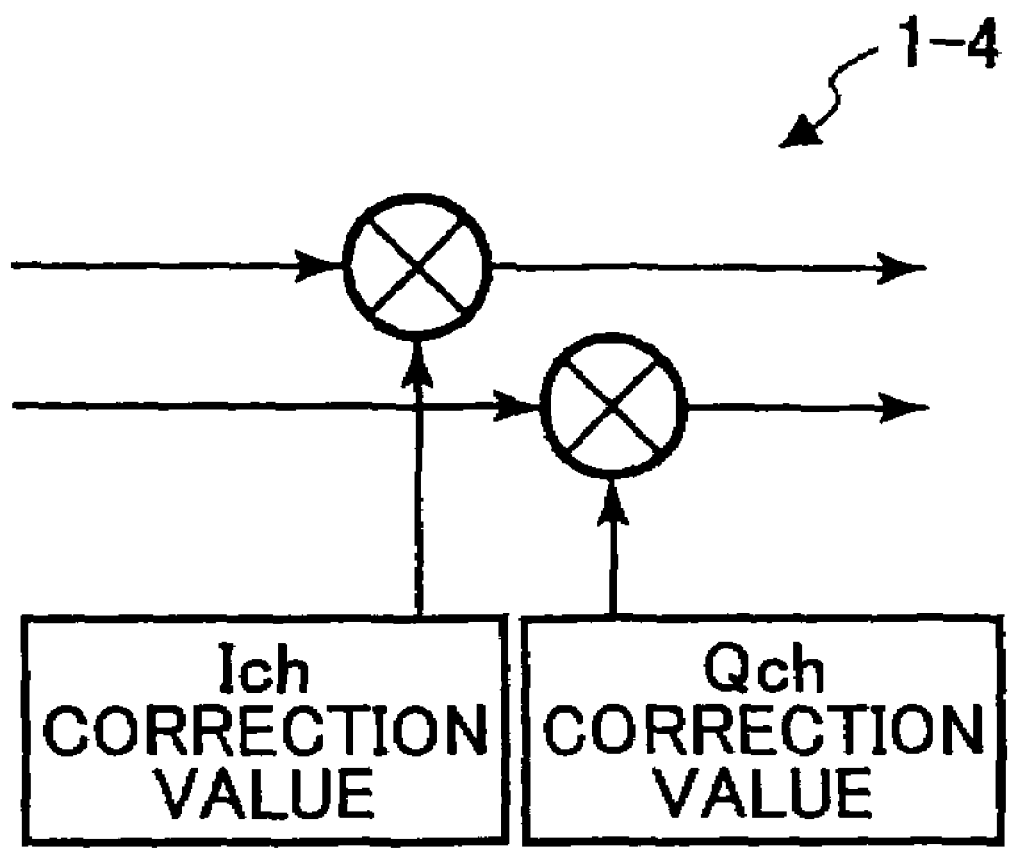
FIG. 6A is a schematic diagram for explaining amplitude correction for the in-phase component (I) and the quadrature component (Q) of the input signal.
Figure 6B:
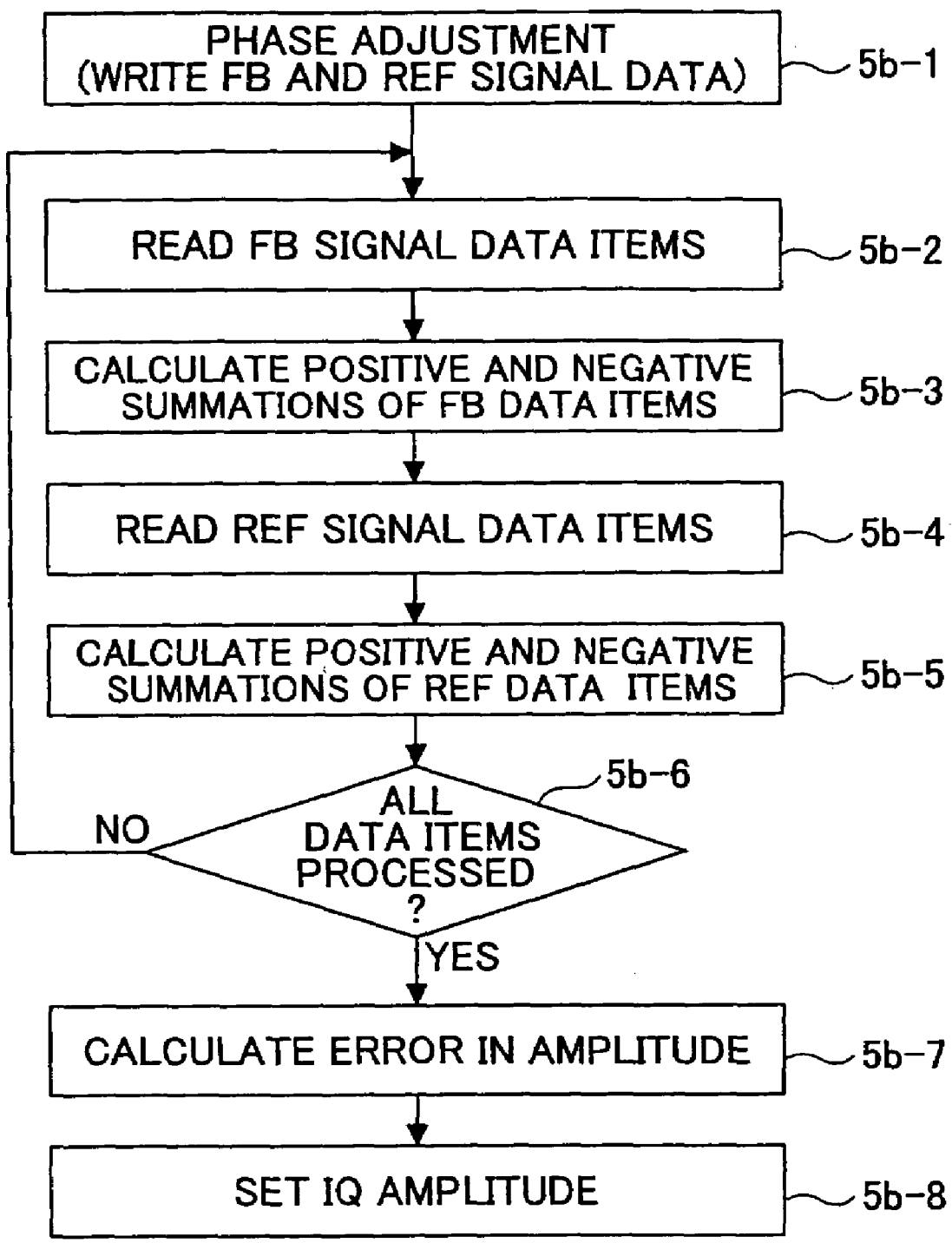
FIG. 6B is a flowchart of operations for IQ amplitude correction.

FIG. 6A illustrates an example of the IQ correction unit 1-4, and FIG. 6B illustrates an operations flow of the IQ correction process. The IQ correction unit 1-4 is configured to multiply the in-phase component (I) and the quadrature component (Q) by the in-phase (Ich) correction value and the quadrature (Qch) correction value, respectively.

In operations shown in FIG. 6B, the current feedback signal (FB) is subjected to phase adjustment and written in the memory 1-10 (step 5b-1). Feedback signal (FB) data items are read from the memory 1-10 (step 5b-2), and a positive summation (i.e., the summation of all the positive feedback signal data values) and a negative summation (i.e., the summation of all the negative feedback signal data values) are determined (step 5b-3).

Reference signal (FB) data items are also read from the memory 1-9 (step 5b-4), and a positive summation (i.e., the summation of all the positive reference signal data values) and a negative summation (i.e., the summation of all the negative reference signal data values) are determined (step 5b-5). The steps 5b-2 through 5b-5 are repeated until all the feedback signal (FB) data items and the reference signal (Ref) data items (step 4b-7) are processed.

When all the data items have been processed (YES in step 5b-6), an error in amplitude is calculated from the mean absolute FB_Bal of the feedback signals and the mean absolute Ref_Bal of the reference signals (step 5b-7). Based on the calculated error, amplitude correction values for the in-phase component (I) and the quadrature component (Q) of the input signal (transmission signal) are determined (step 5b-8).

In the embodiment, the above described distortion compensation and correction for quadrature modulation (including DC offset correction, orthogonality correction, and IQ amplitude correction) are performed only when a phase adjustment value (i.e., a phase difference between the feedback signal and the reference signal) is correctly determined because, with an incorrect phase adjustment value, distortion compensation and/or correction for quadrature modulation cannot be correctly performed.

To realize this, it is determined whether the phase difference between the feedback signal and the reference signal resides in a correct range based on determination as to whether the current phase adjustment result is within an acceptable error range with respect to the previous phase adjustment results.

Figure 7A:
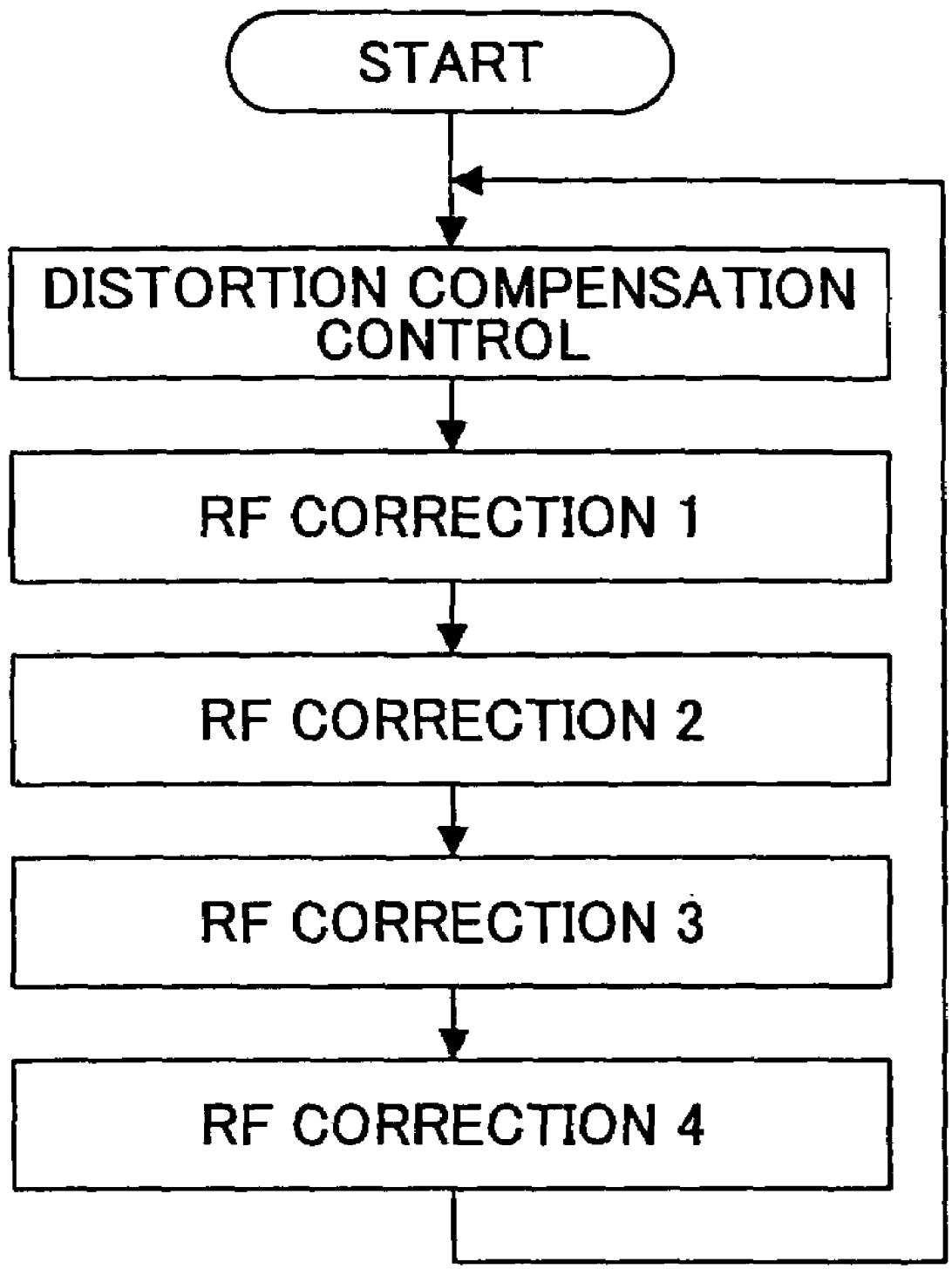
FIG. 7A is an outlined operations flow of the distortion compensation.
Figure 7B:
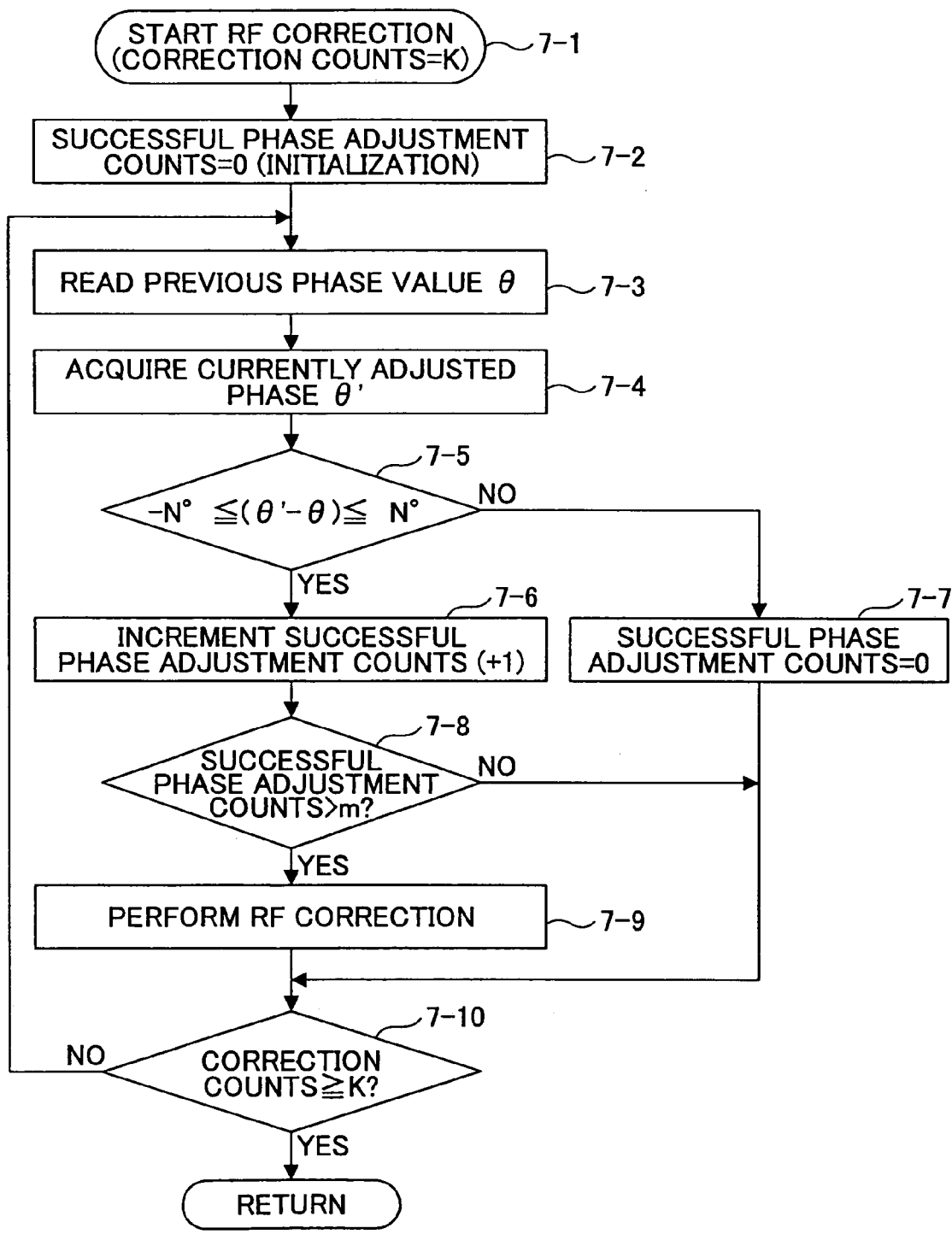
FIG. 7B is a detailed operations flow of correction control for direct RF type quadrature modulation according to an embodiment of the invention.
Figure 8:
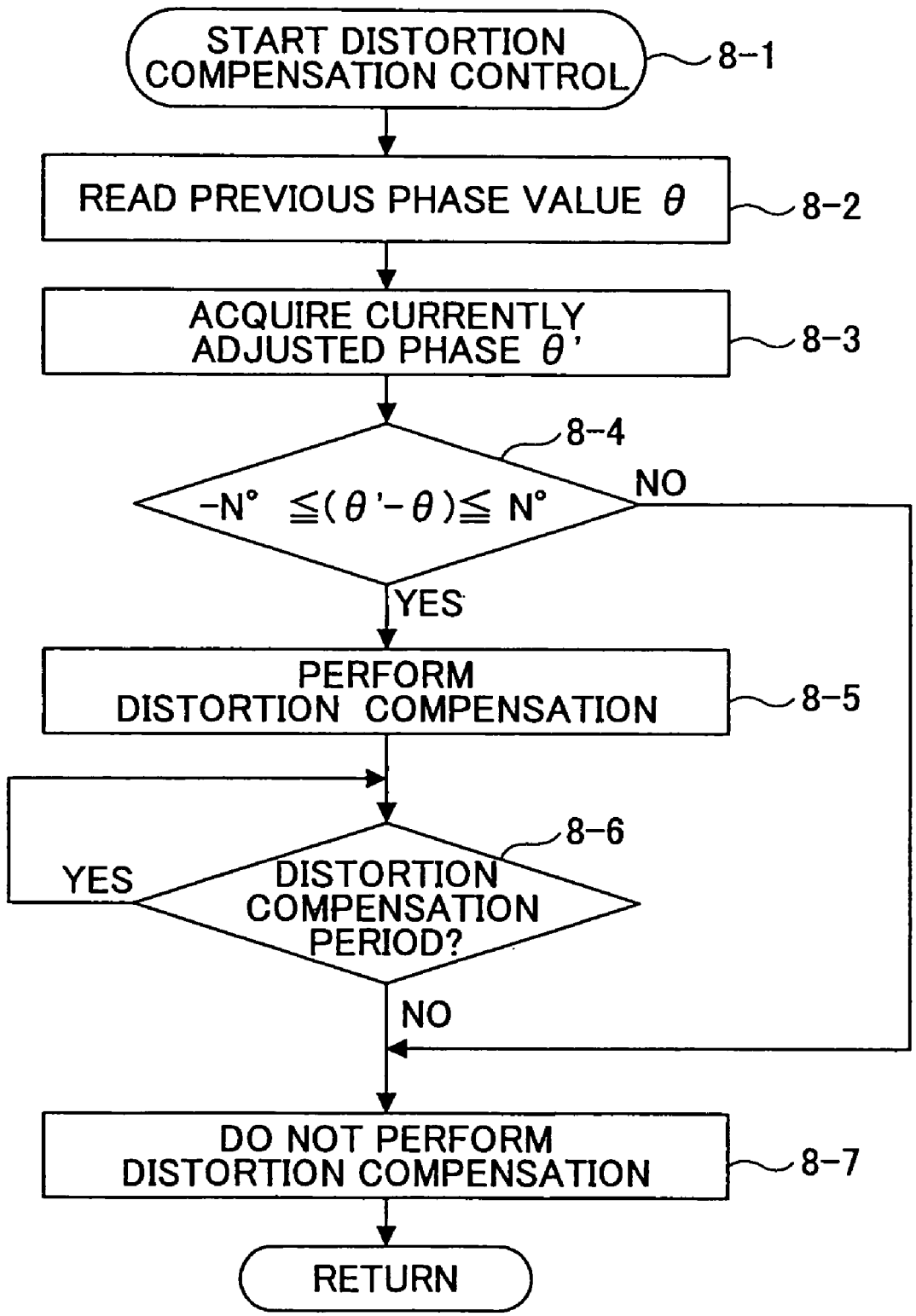
FIG. 8 is a detailed operations flow of distortion compensation control according to an embodiment of the invention.

FIG. 7A, FIG. 7B, and FIG. 8 are flowcharts of distortion compensation control and quadrature modulation correction control. With the distortion compensating device 10 shown in FIG. 2A and FIG. 2B, distortion compensation various types of RF quadrature modulation corrections (e.g., RF correction 1 through RF correction 4) are controlled by the CPU 1-5, as illustrated in FIG. 7A, using a prescribed criterion as to the appropriateness of the phase adjustment performed on the feedback signal.

FIG. 7B is a sub-routine of any one of RF correction controls for quadrature modulation. In the example shown in FIG. 7B, a target correction counts value (or the number of corrections) is set to a prescribed value K (step 7-1), and a successful phase adjustment counts value (i.e., the number of phase adjustments performed with correct phase values) is set to zero for initialization (step 7-2).

Then, the previous phase adjustment result (phase adjusting value θ) is read from the phase adjustment result storing unit 22 shown in FIG. 2B (step 7-3), while a current phase adjustment result (phase adjusting value θ') is acquired by the phase adjusting unit 21 (step 7-4). The current phase adjusting value θ' is compared with the previous phase adjusting value θ and it is determined by the phase adjustment comparison and determination unit 23 whether the difference θ'-θ between the current and previous phase adjustment results is within the range from $-N°$ to $N°$ (step 7-5).

If the difference between the current phase adjusting value θ' and the previous phase adjusting value θ is within the range from $-N°$ to $N°$ (YES in step 7-5), the successful phase adjustment counts value is incremented (step 7-6). If the current phase adjustment result differs from the previous phase adjustment result by an amount that exceeds the ±N range (NO in step 7-5), the successful phase adjustment counts value is maintained at zero (step 7-7), and the process jumps to step 7-10 described below.

After incrementing of the successful phase adjustment counts value, it is determined by the phase adjustment result comparison and determination unit 23 whether the successful phase adjustment counts value is at or above a prescribed value "m" (step 7-8). If the successful phase adjustment counts value is not greater than "m" (NO in step 7-8), the process jumps to step 7-10 without performing RF correction.

If the successful phase adjustment counts value is greater than "m" (YES in step 7-8), the correction control unit 24 generates an instruction for RF correction (for example, an instruction for DC offset correction) to cause the associated element or functional block to perform this RF correction, and the correction counts value is incremented (step 7-9). Then, it is determined whether the RF correction has been performed at least K times (step 7-10). If the correction counts value does not reach K (NO in step 7-10), the process returns to step 7-3 to repeat the process until the RF correction has been performed at least K times.

If the correction counts value reaches K (YES in step 7-10), the sub-routine finishes, and the process returns to the main flow shown in FIG. 7A to perform next RF correction control.

In this manner, if the phase adjustment result (θ) is within the correct range at least a prescribed number (m) of times, RF correction is performed and this RF correction process is repeated until the RF correction is performed at least a target number of times (K times). In the operations flow, N is an acceptable phase error, and m and K are natural numbers.

FIG. 8 is a flowchart of the sub-routine of distortion compensation control shown in FIG. 7A. When distortion compensation control is started (step 8-1), the previous phase adjustment result (phase adjusting value θ) is read from the phase adjustment result storing unit 22 shown in FIG. 2B (step 8-2), while a current phase adjustment result (phase adjusting value θ') is acquired by the phase adjusting unit 21 (step 8-3). The current phase adjusting value θ' is compared with the previous phase adjusting value θ and it is determined by the phase adjustment comparison and determination unit 23 whether the difference θ'-θ between the current and previous phase adjustment results is within the range from $-N°$ to $N°$ (step 8-4).

If the difference between the current phase adjusting value θ' and the previous phase adjusting value θ is within the range from $-N°$ to $N°$ (YES in step 8-4), the correction control unit 24 allows distortion compensation to be performed (step 8-5), and determines whether the current timing is in the distortion compensation period (step 8-6). The distortion compensation is performed until the end of the distortion compensation period. If the current timing is out of the distortion compensation period (NO in step 8-6), distortion compensation is not performed (step 8-7).

In this manner, appropriateness of performing distortion compensation is determined based on whether the comparison result of the current and previous phase adjustment results satisfies a prescribed condition.

With this arrangement, abnormal operation of distortion compensation and/or RF correction for quadrature modulation due to malfunction of an oscillator for the down converter and other elements in an analog section can be prevented.

Because distortion compensation and/or correction for quadrature modulation are performed only when the phase adjustment values are correctly set, undesirable out-of-band radiation can be reduced from the output signal from the transmitter.

This patent application is based on and claims the benefit of the earlier filing date of Japanese Patent Application No. 2005-236814 filed Aug. 17, 2005, the entire contents of which are incorporated herein by reference.

What is claimed is:

1. A distortion compensating device applied to a transmitter for transmitting a quadrature modulated signal in a wireless digital communication system, the distortion compensating device comprising:

a phase adjusting unit configured to determine a phase adjustment value for a feedback signal subjected to a quadrature demodulation, based on a comparison between the feedback signal and a reference signal to be transmitted from the transmitter;

a phase adjustment result storing unit configured to store a current phase adjustment result representing the determined phase adjustment value;

a phase adjustment result comparison and determination unit configured to compare the current phase adjustment result with a previous phase adjustment result, and to output a comparison result; and a correction control unit configured to allow a correction for the quadrature modulation to be performed if the comparison result of the phase adjustment results satisfies a prescribed condition, wherein said correction control circuit increments a successful phase adjustment count if a difference between the current phase adjustment result and the previous phase adjustment result is within a predetermined range and performs the correction only if the successful phase adjustment count exceeds a prescribed value, and repeats incrementing the successful phase adjustment count and performing the correction until said correction is performed a target number of times, and wherein said prescribed condition is satisfied if said difference is within the predetermined range, the successful phase adjustment count exceeds said prescribed value, and the correction is performed said target number of times.

2. The distortion compensating device of claim 1, wherein the correction control unit generates an instruction for performing a direct current offset correction on an in-phase component and a quadrature component of the reference signal, as said correction, if said prescribed condition is satisfied.

3. The distortion compensating device of claim 1, wherein the correction control unit generates an instruction for performing an orthogonality correction on an in-phase component and a quadrature component of the reference signal, as said correction, if said prescribed condition is satisfied.

4. The distortion compensating device of claim 1, wherein the correction control unit generates an instruction for performing amplitude correction on an in-phase component and a quadrature component of the reference signal, as said correction, if said prescribed condition is satisfied.

5. The distortion compensating device of claim 1, wherein the correction control unit sets the successful phase adjustment count to zero if said difference falls outside the predetermined range.

6. A distortion compensating method applied to a transmitter for transmitting a quadrature modulated signal in a wireless digital communication system, the method comprising:

determining, in a phase adjusting unit of the transmitter, a current phase adjustment value for a feedback signal subjected to a quadrature demodulation, based on a comparison between the feedback signal and a reference signal to be transmitted from the transmitter;

comparing, in a phase adjustment result comparison and determination unit of the transmitter, a current phase adjustment result representing the current phase adjustment value with a previous phase adjustment result, and outputting a comparison result; and allowing, in a correction control unit of the transmitter, a correction for the quadrature modulation to be performed if the comparison result of the phase adjustment results satisfies a prescribed condition, wherein said allowing increments a successful phase adjustment count if a difference between the current phase adjustment result and the previous phase adjustment result is within a predetermined range and performs the correction only if the successful phase adjustment count exceeds a prescribed value, and repeats incrementing the successful phase adjustment count and performing the correction until the correction is performed a target number of times, and wherein said prescribed condition is satisfied if said difference is within the predetermined range, the successful phase adjustment count exceeds said prescribed value, and the correction is performed said target number of times.

7. The distortion compensating method of claim 6, wherein at least one of direct current offset correction, orthogonality correction, and amplitude correction for an in-phase component and a quadrature component of the reference signal is performed, as said correction, if said prescribed condition is satisfied.

8. The distortion compensation method of claim 6, wherein said allowing sets, in the correction control unit of the transmitter, the successful phase adjustment count to zero if said difference falls outside the predetermined range.

* * * * *

UNITED STATES PATENT AND TRADEMARK OFFICE
CERTIFICATE OF CORRECTION

Page 1 of 1

PATENT NO.        : 7,688,914 B2
APPLICATION NO.   : 11/319046
DATED             : March 30, 2010
INVENTOR(S)       : Takeshi Ohba et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 947 days.

Signed and Sealed this
Fourth Day of January, 2011

David J. Kappos
*Director of the United States Patent and Trademark Office*

UNITED STATES PATENT AND TRADEMARK OFFICE
CERTIFICATE OF CORRECTION

| | | |
|---|---|---|
| PATENT NO. | : 7,688,914 B2 | |
| APPLICATION NO. | : 11/319046 | |
| DATED | : March 30, 2010 | |
| INVENTOR(S) | : Takeshi Ohba et al. | |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 974 days.

This certificate supersedes the Certificate of Correction issued January 4, 2011.

Signed and Sealed this
Seventeenth Day of May, 2011

David J. Kappos
*Director of the United States Patent and Trademark Office*